United States Patent
Ory et al.

(10) Patent No.: US 8,953,290 B2
(45) Date of Patent: Feb. 10, 2015

(54) DEVICE FOR PROTECTING AN INTEGRATED CIRCUIT AGAINST OVERVOLTAGES

(71) Applicant: STMicroelectronics (Tours) SAS, Tours (FR)

(72) Inventors: Olivier Ory, Tours (FR); Eric Laconde, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 0 days.

(21) Appl. No.: 13/955,112

(22) Filed: Jul. 31, 2013

(65) Prior Publication Data

US 2014/0036399 A1 Feb. 6, 2014

(30) Foreign Application Priority Data

Aug. 1, 2012 (FR) ...................... 12 57470

(51) Int. Cl.
*H02H 9/00* (2006.01)
*H01L 23/62* (2006.01)
*H01L 27/02* (2006.01)

(52) U.S. Cl.
CPC ............ *H01L 23/62* (2013.01); *H01L 27/0255* (2013.01); *H01L 2924/0002* (2013.01)
USPC ........................................................ 361/56

(58) Field of Classification Search
USPC .......................................................... 361/56
See application file for complete search history.

(56) References Cited

U.S. PATENT DOCUMENTS

| 4,889,492 | A | * | 12/1989 | Barden et al. | ................. 438/390 |
| 7,795,987 | B2 | * | 9/2010 | Bobde | ............................. 333/12 |
| 8,377,757 | B2 | * | 2/2013 | Hawe et al. | ................... 438/140 |
| 2003/0228848 | A1 | | 12/2003 | Escoffier et al. | |
| 2008/0310066 | A1 | | 12/2008 | Bobde | |
| 2010/0006889 | A1 | | 1/2010 | Marreiro et al. | |
| 2010/0060349 | A1 | * | 3/2010 | Etter et al. | .................... 327/552 |

FOREIGN PATENT DOCUMENTS

WO    WO 2009/128954 A1    10/2009

OTHER PUBLICATIONS

French Search Report and Written Opinion dated Mar. 25, 2013 from corresponding French Application No. 12/57470.

* cited by examiner

*Primary Examiner* — Scott Bauer
(74) *Attorney, Agent, or Firm* — Allen, Dyer, Doppelt, Milbrath & Gilchrist, P.A.

(57) ABSTRACT

A device for protecting an integrated circuit against overvoltages, the device being formed inside and on top of a semiconductor substrate of a first conductivity type and including: a capacitor including a well of the second conductivity type penetrating into the substrate and trenches with insulated walls formed in the well and filled with a conductive material; and a zener diode formed by the junction between the substrate and the well.

11 Claims, 1 Drawing Sheet

DEVICE FOR PROTECTING AN INTEGRATED CIRCUIT AGAINST OVERVOLTAGES

CROSS REFERENCE TO RELATED APPLICATIONS

This application claims the priority benefit of French patent application serial number 12/57470, filed on Aug. 1, 2012, which is hereby incorporated by reference to the maximum extent allowable by law.

BACKGROUND

1. Technical Field

The present disclosure relates to a device for protecting an integrated circuit against overvoltages, and more specifically against electrostatic discharges.

2. Discussion of the Related Art

FIG. 1 is an electric diagram of an example of a device for protecting an integrated circuit against overvoltages. This device comprises a zener diode 101 having its anode connected to a low power supply terminal or rail GND of the circuit to be protected (not shown), and having its cathode connected to a high power supply terminal or rail $V_{CC}$ of the circuit to be protected. The device of FIG. 1 further comprises a diode 103 forward-connected between terminal GND and an input-output pad IO1 of the circuit to be protected, a diode 104 forward-connected between pad IO1 and terminal $V_{CC}$, a diode 105 forward-connected between terminal GND and an input-output pad IO2 of the circuit to be protected, and a diode 106 forward-connected between pad IO2 and terminal $V_{CC}$.

The device of FIG. 1 enables removing overvoltages that may occur between any two of pads of rails IO1, IO2, $V_{CC}$, and GND of the circuit to be protected. For positive overvoltages between IO1 and GND, IO1 and IO2, $V_{CC}$ and GND, IO2 and GND, IO2 and IO1, $V_{CC}$ and IO1, and $V_{CC}$ and IO2, the threshold for triggering the protection is equal to the avalanche voltage of zener diode 101 plus the forward voltage drop of one of diodes 103 to 106 (generally 0.6 V) or of two of diodes 103 to 106 in series (generally 1.2 V). For the other overvoltages, the triggering threshold is equal to the forward voltage drop of one of diodes 101 and 103 to 106 (generally 0.6 V).

Diodes 101 and 103 to 106 of the protection device of FIG. 1 are generally integrated on the same semiconductor chip which may be either an independent chip intended to be connected to terminals IO1, IO2, $V_{CC}$, and GND of the circuit to be protected, or the actual chip containing the circuits to be protected.

FIG. 2 is an electric diagram of another example of a device for protecting an integrated circuit against overvoltages. The device of FIG. 2 comprises the same elements as the device of FIG. 1, and further comprises, between terminals $V_{CC}$ and GND of the circuit to be protected, that is, in parallel with zener diode 101, a capacitor 201.

For fast voltage variations (high frequency) between terminals $V_{CC}$ and GND, capacitor 201 behaves substantially as a closed circuit (short-circuit). Thus, in case of an abrupt overvoltage, for example, in case of an electrostatic discharge, capacitor 201 enables to start removing the overvoltage in the time interval preceding the turning-on of zener diode 101, that is, between the time when the overvoltage exceed the protection triggering threshold and the time when the zener diode becomes fully conductive by avalanche effect.

The device of FIG. 2 thus provides a better protection than the device of FIG. 1 and is generally preferred to the device of FIG. 1 to protect the most critical circuits.

However, a disadvantage of the device of FIG. 2 is that, in practice, unlike diodes 101 and 103 to 106 which are integrated on the same semiconductor chip, capacitor 201 is a discrete component. This forces to provide space and additional tracks on the printed circuit board where the circuit to be protected and the protection device are assembled, and additional solder operations on assembly.

SUMMARY

An embodiment provides a device for protecting an integrated circuit against overvoltages at least partly overcoming some disadvantages of known devices.

An embodiment provides a device of protection against overvoltages, capable of protecting critical circuits, even in case of a fast overvoltage peak.

An embodiment provides a device of protection against overvoltages comprising no discrete component.

An embodiment provides a device for protecting an integrated circuit against overvoltages, the device being formed inside and on top of a semiconductor substrate of a first conductivity type and comprising: a capacitor comprising a well of the second conductivity type penetrating into the substrate and trenches with insulated walls formed in the well and filled with a conductive material; and a zener diode formed by the junction between the substrate and the well.

According to an embodiment, the upper surface of the substrate is coated with an epitaxial layer of the second conductivity type, the well extending across the entire thickness of the epitaxial layer and across a portion of the thickness of the substrate.

According to an embodiment, the substrate is connected to the conductive material via an insulating wall vertically crossing the epitaxial layer and comprising a conductive region connecting the substrate to the upper surface of the epitaxial layer.

According to an embodiment, the insulating wall is a diffused wall of the first conductivity type.

According to an embodiment, the insulating wall comprises a trench filled with a conductive material crossing the epitaxial layer, this trench being surrounded with a thin region of the first conductivity type.

According to an embodiment, the device further comprises first and second diodes in series between the anode and the cathode of the zener diode, the anode of the first diode being on the anode side of the zener diode and the cathode of the second diode being on the cathode side of the zener diode.

According to an embodiment, the first diode is formed by the junction between the substrate and a first portion of the epitaxial layer; and the second diode is formed by the junction between a second portion of the epitaxial layer and a region of the first conductivity type formed in the second portion.

According to an embodiment, the device further comprises third and fourth diodes in series between the anode and the cathode of the zener diode, the anode of the third diode being on the anode side of the zener diode and the cathode of the fourth diode being on the cathode side of the zener diode.

According to an embodiment, the cathode of the zener diode is intended to be connected to a high power supply terminal of the circuit to be protected, and the anode of the zener diode is intended to be connected to a low power supply terminal of the circuit to be protected.

According to an embodiment, the cathode of the first diode and the anode of the second diode are intended to be connected to a first input-output terminal of the circuit to be protected, and the cathode of the third diode and the anode of the fourth diode are intended to be connected to a second input-output terminal of the circuit to be protected.

According to an embodiment, the first conductivity type is type P and the second conductivity type is type N.

BRIEF DESCRIPTION OF THE DRAWINGS

The foregoing and other features and advantages will be discussed in detail in the following non-limiting description of specific embodiments in connection with the accompanying drawings.

For clarity, the same elements have been designated with the same reference numerals in the different drawings and, further, as usual in the representation of integrated circuits, the various drawings are not to scale.

DETAILED DESCRIPTION

Figure 3:
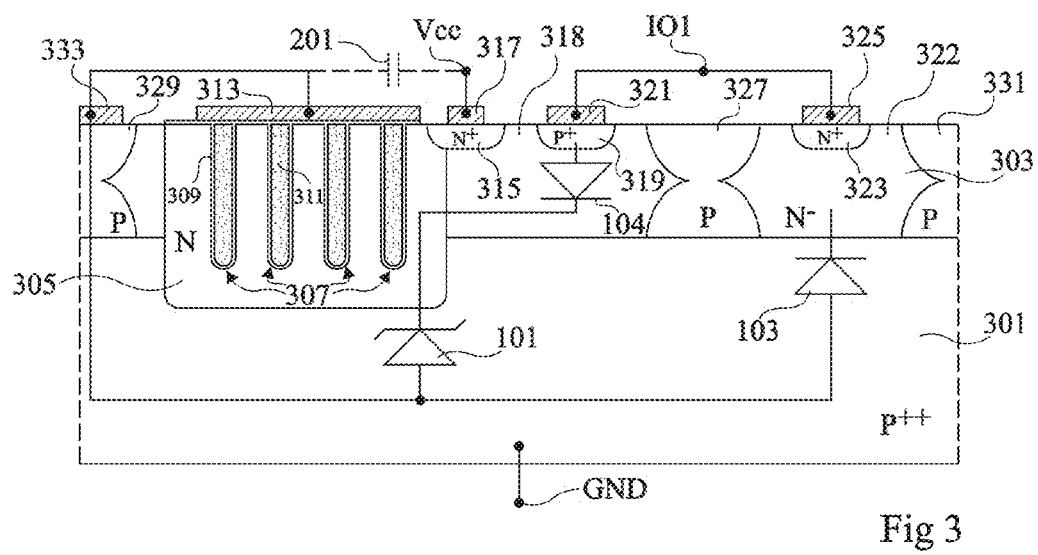
FIG. 3 is a partial simplified top view illustrating an embodiment of a device for protecting an integrated circuit against overvoltages.

FIG. 3 is a partial simplified top view illustrating an embodiment of a device for protecting an integrated circuit (not shown) against overvoltages. The electric diagram of the protection device of FIG. 3 is the same as that of the device of FIG. 2. However, the cross-section view of FIG. 3 only shows capacitor 201, zener diode 101, and diodes 103 and 104, diodes 105 and 106 being masked by the above-mentioned components.

The protection device of FIG. 3 is formed inside and on top of a P-type doped semiconductor substrate 301, for example, a silicon substrate. In this example, substrate 301 is heavily doped ($P^{++}$), and the upper surface of the substrate is coated with a lightly N-type doped epitaxial layer 303 ($N^-$), for example, a layer having a thickness ranging between 5 and 10 μm.

In a portion of the device (left-hand portion in the orientation of the drawing), an N-type doped well 305 (N), having a heavier doping level than epitaxial layer 303, extends from the upper surface of layer 303 and thoroughly crosses layer 303 and a portion of substrate 301. As an example, well 305 penetrates into substrate 301 down to a depth ranging from 5 to 50 μm. Trenches 307 extend from the upper surface of the well and stop a little before the bottom of the well. To form such a structure, one may, for example, first, form vertical trenches 307 crossing layer 303 and a portion of substrate 301, and, second, form well 305 by diffusion of N-type dopant elements from the lateral walls and the bottom of trenches 307. As an example, the trenches may be filled with a phosphorus-based solution, for example, a phosphorus oxychloride solution, and wait for phosphorus to diffuse into layer 303 and substrate 301 to form well 305.

The walls of trenches 307 and the upper surface of well 305 are then coated with a thin dielectric layer 309, for example, made of silicon oxide, after which the trenches are filled with a conductive material 311, for example, doped polysilicon. Conductive material 311 on the one hand and N-type doped well 305 on the other hand form the two electrodes of capacitor 201, layer 309 forming the capacitor dielectric. The capacitance of capacitor 201 especially depends on the thickness of dielectric layer 309 and on the electrode surface area. As an example, to obtain good protection performance, a capacitor 201 having a capacitance ranging from 10 to 100 nF may be provided.

On the upper surface side of well 305, a metallization 313 covers trenches 307 and forms an electric contact with the upper portion of material 311. Further, a contacting region 315 more heavily N-type doped ($N^+$) than well 305 is formed in the upper portion of the well. A metallization 317 at least partly covers region 315 and enables to take an electric contact on the well.

In this example, region 315 is formed in front of an edge of well 305 (the right edge in the orientation of the drawing), and extends laterally, partly in well 305 and partly in layer 303 outside of the well. Thus, metallization 317 enables contacting both well 305 and a portion 318 of layer 303 located between well 305 and an insulating wall 327 vertically extending across the entire thickness of layer 303. On the side of well 305 opposite to epitaxial layer portion 318 (to the left of the well in the orientation of the drawing), a second insulating wall 329 delimits the portion of epitaxial layer 303 capable of being biased via metallization 317.

In an upper portion of epitaxial layer portion 318, between contacting region 315 and insulating wall 327, a heavily-doped P-type region 319 ($P^+$), having its upper surface at least partially coated with a metallization 321, is provided.

In an upper portion of another portion 322 of epitaxial layer 303, located between insulating wall 327 and a third insulating wall 331, a heavily-doped N-type region 323 ($N^+$) having its upper surface at least partially coated with a metallization 325 is provided.

Insulating walls 327, 329, and 331, for example, are P-type doped walls formed by diffusion of dopant elements from the upper and lower surfaces of layer 303. To form the lower portion of the insulating walls, before the forming of epitaxial layer 303, a step of local implantation of P-type dopants in the upper portion of substrate 301 is for example provided, to create a stock of P-type dopant elements in the substrate areas in front of which the insulating walls are desired to be subsequently formed.

In this example, a metallization 333 covers the upper surface of wall 329. Metallizations 313 and 333 on the one hand, and 321 and 325 on the other hand, are interconnected, for example via conductive tracks (not shown).

Zener diode 101 is formed by the PN junction between substrate 301 and well 305. The anode region of zener diode 101 (that is, substrate 301) is connected to the electrode of capacitor 201 comprising conductive material 311, via insulating wall 329 and metallizations 333 and 313. The cathode region of zener diode 101 is confounded with the second electrode of capacitor 201, that is, well 305, so that the zener diode and capacitor 201 are connected in parallel.

Diodes 103 and 104 are respectively formed by the PN junction between substrate 301 and epitaxial layer portion 322, and by the PN junction between region 319 and epitaxial layer portion 318. The cathode region of zener diode 101, that is, well 305, and the cathode region of diode 104, that is, epitaxial layer portion 318, are connected via contacting region 315 and metallization 317. The anode region of diode 104, that is, P-type region 319, and the cathode region of diode 103, that is, epitaxial layer portion 322, are connected via metallizations 321 and 325 and N-type region 323. The anode regions of zener diode 101 and of diode 103 are connected via substrate 301. Thus, diodes 103 and 104 are series-connected, parallel to zener diode 101 and to capacitor 201, the anode of diode 103 being on the anode side of zener diode 101.

Although this is not shown in FIG. 3, the protection device of FIG. 3 further comprises, in parallel with zener diode 101, capacitor 201, and diodes 103 and 104, series-connected diodes 105 and 106, the anode of diode 105 being on the anode side of zener diode 101. Diodes 105 and 106 are for example formed in epitaxial layer 303 similarly to diodes 103 and 104. Insulating walls (not shown in FIG. 3) may be provided to separate diode 105 from diode 106 and diodes 103 and 104 from diodes 105 and 106.

In use, metallization 317 is intended to be connected to a high power supply terminal $V_{CC}$ of the circuit to be protected, and substrate 301 is intended to be connected to a low power supply terminal GND of the circuit to be protected, for example, via a contacting area (not shown) formed on the back side of the substrate 301, or via insulating walls 327, 329, and/or 331. Further, metallizations 321 and 325 are intended to be connected to a first input-output terminal IO1 of the circuit to be protected, the anode of diode 106 and the cathode of diode 105 being intended to be connected to an output terminal IO2 of the circuit to be protected.

Figures 1, 2:
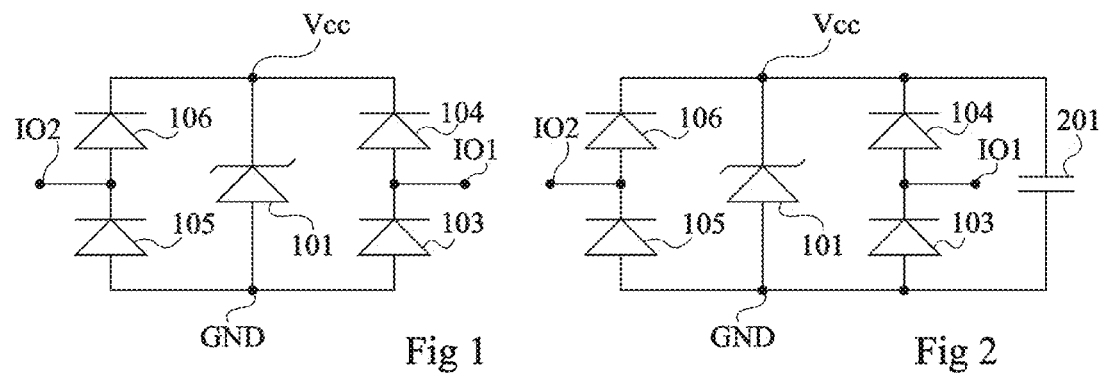
FIG. 1, previously described, is an electric diagram of an example of a device for protecting an integrated circuit against overvoltages.
FIG. 2, previously described, is an electric diagram of another example of a device for protecting an integrated circuit against overvoltages.

Thus, the protection device of FIG. 3 comprises, integrated on a same semiconductor chip, all the elements of the device of FIG. 2. The device of FIG. 3 may be formed either on an independent chip intended to be connected to terminals IO1, IO2, $V_{CC}$, and GND of the circuit to be protected, or on a chip also comprising other circuits, for examples, the actual circuits to be protected.

An advantage of the device of FIG. 3 is that it enables to protect critical integrated circuits, even in case of a fast overvoltage peak.

Another advantage of the device of FIG. 3 is that it comprises no discrete component, which simplifies its assembly and limits its bulk.

Another advantage of the device of FIG. 3 is due to the fact that the zener diode is formed by the PN junction between substrate 301 and well 305 where capacitor 201 is formed. This avoids having to provide a specific N-type region to form the cathode region of the zener diode, which would increase the surface area taken up by the device.

It should be noted that in the device of FIG. 3, to adjust the turn-on threshold of the zener diode, it may be provided to adjust the doping level of well 305, it being understood that for a given doping level of substrate 301, the higher the doping level of well 305, the lower the avalanche voltage of the zener diode, and conversely.

Figure 4:
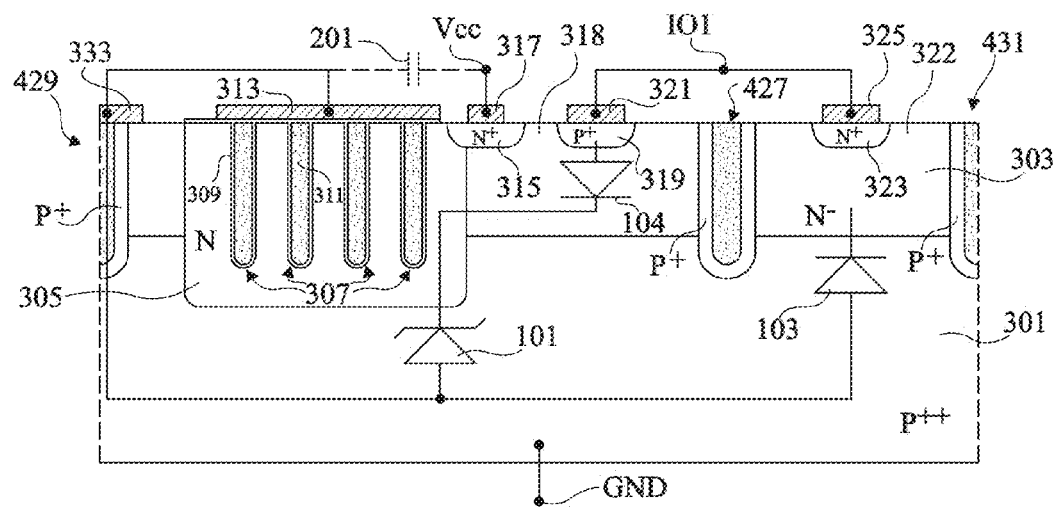
FIG. 4 is a partial simplified top view illustrating an alternative embodiment of a device for protecting an integrated circuit against overvoltages.

FIG. 4 is a partial simplified top view illustrating an alternative embodiment of a device for protecting an integrated circuit (not shown) against overvoltages.

The device of FIG. 4 differs from the device of FIG. 3 in that diffused walls 327, 329, and 331 of the device of FIG. 3 have been replaced with insulating walls 427, 429, and 431 of another type.

The insulating walls of the device of FIG. 4 each comprise a vertical trench crossing epitaxial layer 303 and penetrating into substrate 301, the walls of this trench being surrounded with a thin heavily-doped P-type region ($P^+$) forming a cladding around the trench, and the trench being filled with a conductive material, for example, metal or polysilicon. As an example, these trenches are formed at the same time as trenches 307 of capacitor 201, and a step of implantation or diffusion of P-type dopant elements from the inside of these trenches is provided before their filling with a conductive material.

An advantage of the embodiment of FIG. 4 is that insulating walls 427, 429, and 431 take up, in top view, a smaller surface area than diffused walls 327, 329, and 331 of the embodiment of FIG. 3, which enables to form a more compact protection device.

Another advantage is that to form the device of FIG. 4, it is not necessary to provide a step of vertical diffusion of P-type dopant elements across the entire thickness of epitaxial layer 303, which may be relatively long, especially when epitaxial layer 303 is thick.

Specific embodiments of the present invention have been described. Various alterations, modifications, and improvements will readily occur to those skilled in the art.

In particular, the present invention is not limited to the specific embodiments described in relation with FIGS. 3 and 4. More generally, it is here provided, in any device of protection against overvoltages comprising a zener diode and a capacitor having an electrode connected to the cathode of the zener diode, to integrate the capacitor and the zener diode in a same semiconductor chip comprising a P-type substrate, the capacitor comprising an N-type doped well penetrating into the substrate and containing trenches with insulated walls filled with a conductive material, and the zener diode being formed by the PN junction between the substrate and the capacitor well. It will in particularly be within the abilities of those skilled in the art to adapt the provided structure to protection devices having an electric diagram different from that of FIG. 2. It will also be within the abilities of those skilled in the art to adapt the provided structure to devices comprising no N-type epitaxial layer above the P-type substrate where the capacitor well is formed.

Further, the present invention is not limited to the above-described examples where the protection device is formed from a P-type substrate and where the well containing capacitor 201 is an N-type substrate. It will be within the abilities of those skilled in the art to obtain the desired operation by inverting all the conductivity types described in the present application.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device for protecting an integrated circuit against overvoltages, the device being formed inside and on top of a semiconductor substrate of a first conductivity type and comprising:
    a capacitor comprising a well of the second conductivity type penetrating into the substrate and trenches with insulated walls formed in the well and filled with a conductive material; and
    a zener diode formed by the junction between the substrate and the well.

2. The device of claim 1, wherein the upper surface of the substrate is coated with an epitaxial layer of the second conductivity type, the well extending across the entire thickness of the epitaxial layer and across a portion of the thickness of the substrate.

3. The device of claim 2, wherein the substrate is connected to said conductive material via an insulating wall vertically crossing the epitaxial layer and comprising a conductive region connecting the substrate to the upper surface of the epitaxial layer.

4. The device of claim 3, wherein the insulating wall is a diffused wall of the first conductivity type.

5. The device of claim 3, wherein the insulating wall comprises a trench filled with a conductive material crossing the epitaxial layer, this trench being surrounded with a thin region of the first conductivity type.

6. The device of claim 2, further comprising first and second diodes in series between the anode and the cathode of the zener diode, the anode of the first diode being on the anode side of the zener diode and the cathode of the second diode being on the cathode side of the zener diode.

7. The device of claim 6, wherein:
the first diode is formed by the junction between the substrate and a first portion of the epitaxial layer; and
the second diode is formed by the junction between a second portion of the epitaxial layer and a region of the first conductivity type formed in said second portion.

8. The device of claim 6, further comprising third and fourth diodes in series between the anode and the cathode of the zener diode, the anode of the third diode being on the anode side of the zener diode and the cathode of the fourth diode being on the cathode side of the zener diode.

9. The device of claim 1, wherein the cathode of the zener diode is intended to be connected to a high power supply terminal of the circuit to be protected, and the anode of the zener diode is intended to be connected to a low power supply terminal of the circuit to be protected.

10. The device of claim 8, wherein the cathode of the first diode and the anode of the second diode are intended to be connected to a first input-output terminal of the circuit to be protected, and the cathode of the third diode and the anode of the fourth diode are intended to be connected to a second input-output terminal of the circuit to be protected.

11. The device of claim 1, wherein the first conductivity type is type P and the second conductivity type is type N.

\* \* \* \* \*